(12) United States Patent
Broer et al.

(10) Patent No.: US 7,538,930 B2
(45) Date of Patent: May 26, 2009

(54) MICRO-MECHANICAL THERMO STRUCTURE AND METHOD FOR MANUFACTURING SUCH MICRO-MECHANICAL STRUCTURE

(75) Inventors: Dirk Jan Broer, Eindhoven (NL); Grietje Neeltje Mol, Eindhoven (NL); Christiane Maria Rosette De Witz, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 582 days.

(21) Appl. No.: 10/539,388

(22) PCT Filed: Nov. 20, 2003

(86) PCT No.: PCT/IB03/05460

§ 371 (c)(1),
(2), (4) Date: Jun. 15, 2005

(87) PCT Pub. No.: WO2004/056547

PCT Pub. Date: Jul. 8, 2004

(65) Prior Publication Data
US 2007/0053051 A1    Mar. 8, 2007

(30) Foreign Application Priority Data
Dec. 20, 2002    (EP)    .................... 02080519

(51) Int. Cl.
*G02F 1/01*    (2006.01)
*G02B 26/08*    (2006.01)

(52) U.S. Cl. ...................... 359/288; 359/298

(58) Field of Classification Search ................ 359/288, 359/290–298
See application file for complete search history.

(56) References Cited

U.S. PATENT DOCUMENTS

| 4,074,253 | A | 2/1978 | Nadir |
| 4,235,522 | A | 11/1980 | Simpson et al. |
| 4,729,636 | A | 3/1988 | Te Velde et al. |
| 5,405,490 | A | 4/1995 | Park et al. |
| 5,481,396 | A | 1/1996 | Ji et al. |
| 5,784,190 | A | 7/1998 | Worley |
| 6,080,988 | A | 6/2000 | Ishizuya et al. |
| 6,137,623 | A | 10/2000 | Roberson et al. |
| 6,236,491 | B1 | 5/2001 | Goodwin-Johansson |
| 6,423,260 | B1 | 7/2002 | Chartoff et al. |

FOREIGN PATENT DOCUMENTS

| EP | 1103835 A1 | 5/2001 |
| WO | 9744409 A1 | 11/1997 |

*Primary Examiner*—Scott J Sugarman
*Assistant Examiner*—Dawayne A Pinkney

(57) ABSTRACT

The invention relates to a micro-mechanical thermal structure for modulating a light beam and a method for manufacturing such a structure. The micro-mechanical structure comprises two layers of material with different thermal expansion coefficients in a first direction and a second direction respectively, in which the first direction is transverse to the second direction and the two layers comprise an oriented polymer and the director of the molecules of the oriented polymer of the first layer is transverse to the director of the molecules of the oriented polymer of the second layer. An array of such micromechanical structures may form a thermo-optical modulator for modulating light. The method comprises a step of providing a mold with an orientation-inducing layer to obtain a molecular orientation in a mono-meric state of liquid crystalline monomers and a step of fixing the molecular orientation by photo-polymerization.

18 Claims, 4 Drawing Sheets

MICRO-MECHANICAL THERMO STRUCTURE AND METHOD FOR MANUFACTURING SUCH MICRO-MECHANICAL STRUCTURE

The invention relates to a micro-mechanical thermal structure. The invention further relates to a thermo-optical modulator comprising such micro-mechanical thermal structure and a method for manufacturing such a micro-mechanical thermal structure.

Micro-mechanical thermal structures of this type can be used in, devices for modulating radiation, such as switchable mirrors, smart windows, fast imaging devices and optical recording media.

A micro-mechanical thermal structure of the type mentioned in the opening paragraph is known from U.S. Pat. No. 6,137,623. This document discloses a thermally actuated plate wherein a heater is sandwiched between two polymer layers, in which the polymer layers have different coefficients of thermal expansion. For example, in case both layers have the same length at a first initial temperature, the length of one layer will vary from the length of the other layer at a different temperature from the initial temperature.

Furthermore, this document discloses a thermo-optical modulator comprising a plurality of thermo-optical structures positioned on a micro-electronic substrate forming a reflective surface wherein the thermo-optical structure introduces a discontinuity in the reflective surface by selectively heating the thermo-optical structures so that impinging radiation can be reflected or absorbed.

A disadvantage of the known thermo-optical structures is that they are manufactured by conventional micro-electronic or micro-mechanical techniques which requires inter alia several masking and etching steps.

It is an object of the invention to provide a micro-mechanical thermal structure as mentioned in the opening paragraph and a thermo-optical modulator which can be manufactured by intrinsically simple techniques. To achieve this object, a first aspect of the invention provides a micro-mechanical structure as specified in claim 1 and a second aspect of the invention provides a thermo-optical modulator as claimed in claim 6. The invention is based, inter alia, on the recognition that in case of an oriented polymer, for example, a liquid crystalline polymerized network, the thermal expansion of the aligned liquid crystalline polymerized network in a direction parallel to the molecular director differs from the thermal expansion in a direction perpendicular to the molecular director. In case the two layers of the micro-mechanical thermal structure are adhered to each other, a change of temperature will lead to bending of the micro-mechanical thermal structure. This thermal expansion behavior is reversible.

In this application director means the average direction of the longitudinal axis of the oriented polymer molecule.

In case more than one micro-mechanical structure is made on a single substrate, a thermo-optical modulator can be obtained. A thermo-optical modulator is based on the fact that the polymer layers of each micro-mechanical thermal structure are provided with an absorbing dye or a reflective coating and are oriented on a transparent substrate in a way that, in a first state at a first temperature, the micro-mechanical structures are capable of shutting off a portion of an underlying surface and of stopping incident light and, in a second state at a second temperature, they are capable of transmitting a portion of the incident light via the transparent substrate.

A particular advantageous embodiment is specified in claim 2. Liquid crystalline polymerized materials are the reaction products of monomers or of a mixture of monomers comprising a reactive group. Such polymeric materials have the advantage that the liquid crystalline groups can be oriented prior to polymerization. Polymerization causes such an orientation to be frozen as it were in its initial state wherein the orientation has been induced. These liquid crystalline materials are known per se from published international patent application WO97/44409.

A further embodiment is specified in claim 3. In this embodiment a mechanical coupling is obtained intrinsically when a bilayer structure is made from a single layer of polymer material having a twisted director pattern. This embodiment can be made by photoreplication from a mold that is provided with an orientation inducing layer that establishes a different, but well-controlled molecular orientation in the monomeric state of the liquid crystalline monomers, which is subsequently fixed in the photopolymerization process.

Preferably, the liquid crystalline material are plain oriented with the director at one side of the single layer being oriented parallel to the single layer, and the director on the other side of the single layer being oriented perpendicular to the single layer.

It is a further object of the invention to provide a method of manufacturing micro-mechanical thermal structures as mentioned in the opening paragraph which is relatively simple to apply. This object is achieved by the method as specified in claim 9. In this way, a thermo-optical modulator or a micro-mechanical thermal structure can be made by photoreplication from a mold that is provided with an orientation inducing layer that establishes a different, but well-controlled molecular orientation in the monomeric state of the liquid crystalline monomers, which is subsequently fixed in the polymerization process.

Further advantageous embodiments are specified in the dependent claims.

These and other aspects of the invention are apparent from and will be elucidated with reference to the embodiments described hereinafter.

Figure 3:
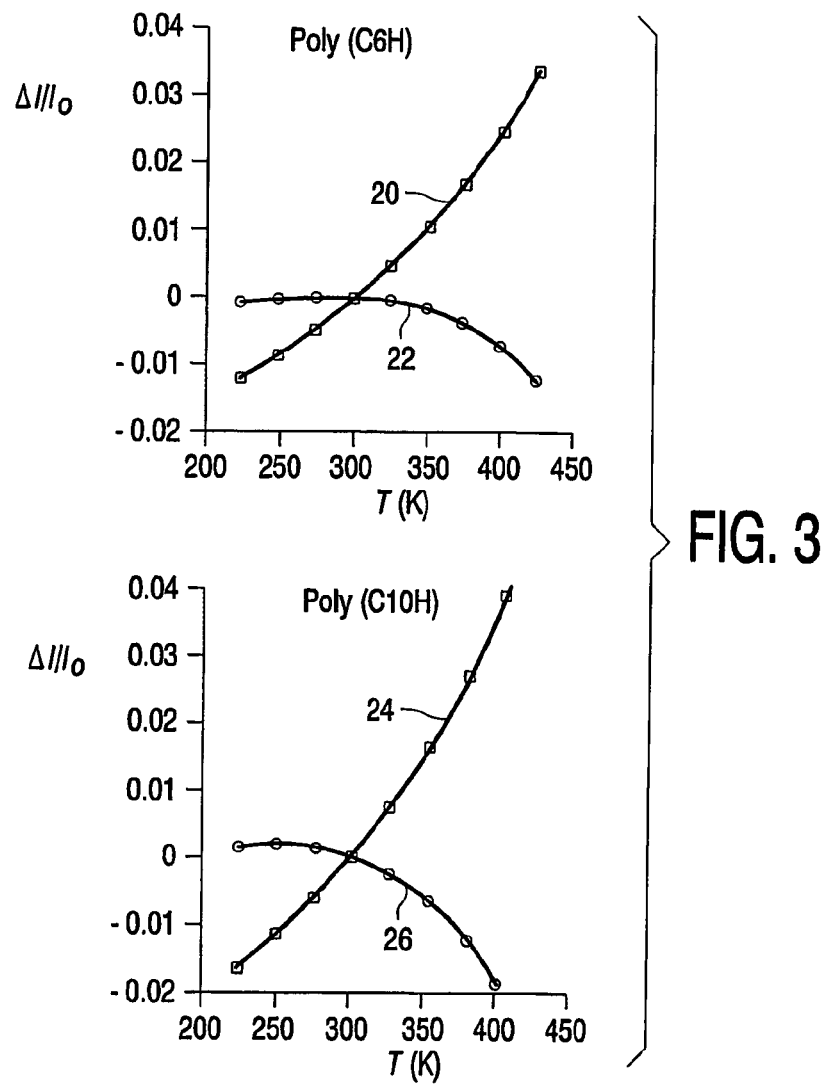
Figure 4:
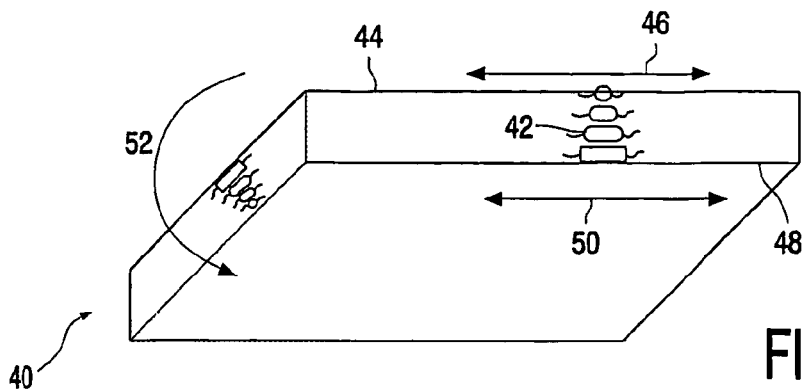
Figure 5:
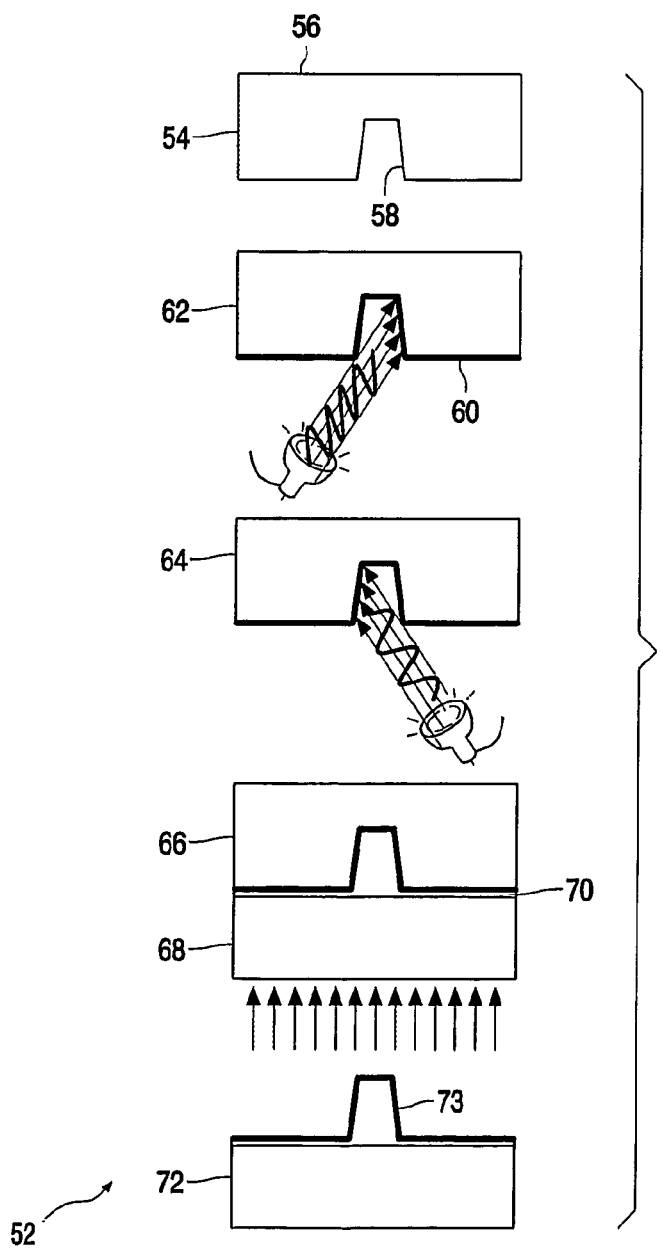
Figure 6:
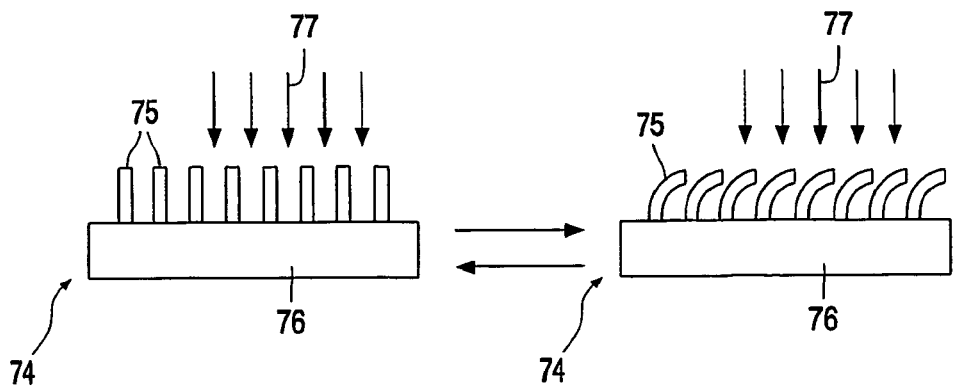
Figure 7:
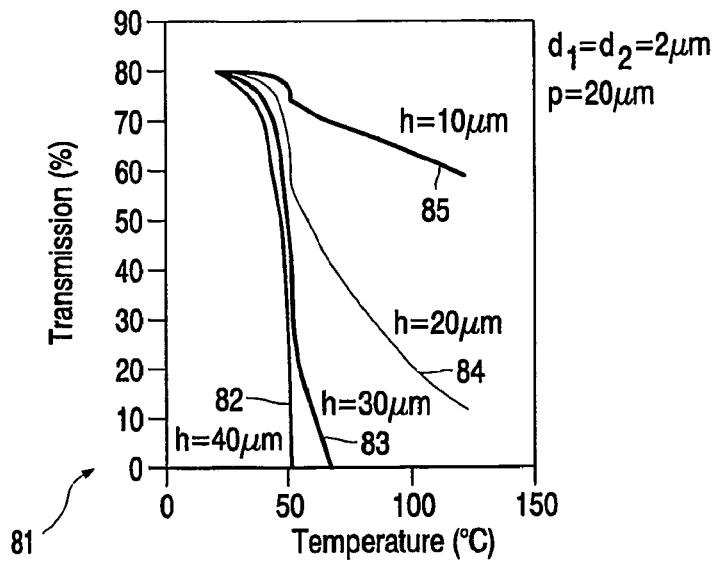
Figure 7:
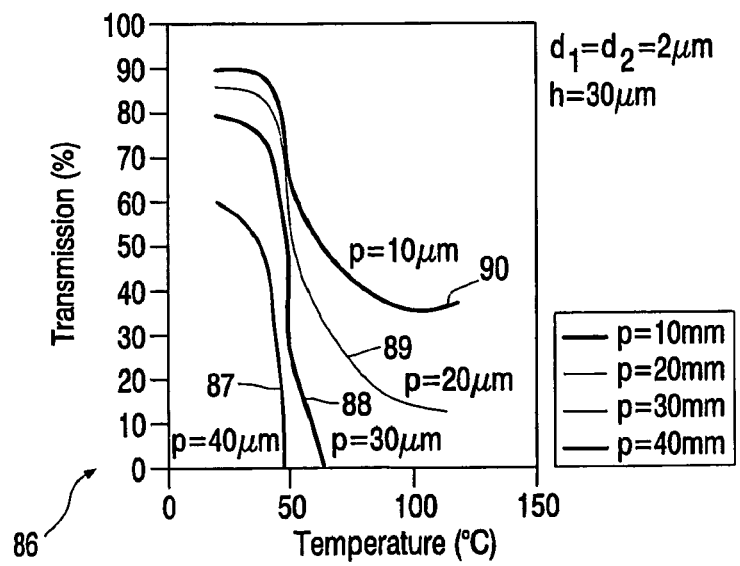

FIG. 3 shows a graph of the thermal expansion poly C6H and the poly C10H liquid crystalline networks, FIG. 4 diagrammatically shows a twisted liquid crystalline network that will bend when the temperature is changed, FIG. 5 shows process steps of a replication process for making a twisted liquid crystalline molecular structure, FIG. 6 diagrammatically shows a thermo-optical modulator and FIG. 7 shows a transmission temperature diagram of a thermo-optical modulator as a function of temperature.

Figure 1:
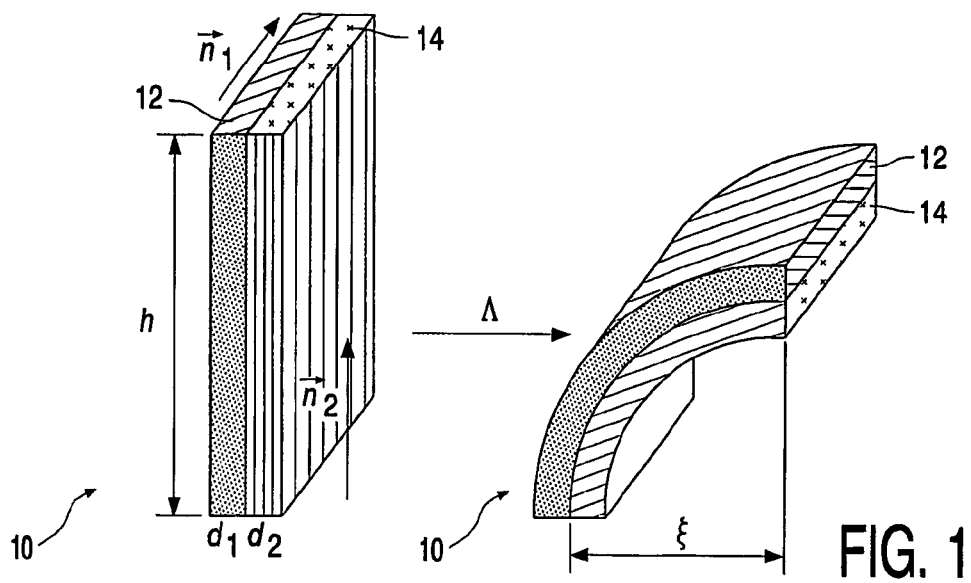
FIG. 1 shows a known polymeric bilayer element.

FIG. 1 diagrammatically shows a micro-mechanical thermal structure 10 comprising two layers 12,14 of oriented polymer material of length h and thickness $d_1$ and $d_2$ respectively, with different thermal expansion coefficients in a first direction and in a second direction, respectively. The director n1 of the molecules of the oriented polymer of the first layer 12 is perpendicular to the director n2 of the molecules of the oriented polymer of the second layer 14. Preferably, the oriented polymers are made of liquid crystalline monomers.

Furthermore, the first and second layers 12,14 can be made of the same liquid crystalline polymerized material. In this liquid crystalline polymerized material, the thermal expansion in a certain direction depends on the orientation of that direction with respect to the director of the molecules in the liquid crystalline polymerized networks. In this example, the expansion coefficient in the direction is the largest in the direction coinciding with the director of the molecules in the liquid crystalline polymerized networks.

Figure 2:
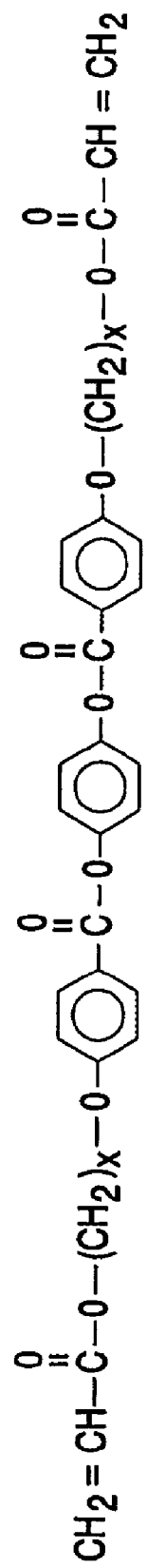
FIG. 2 shows a schematic polymer network of C6H and C10H.

FIG. 2 shows a molecular diagram 16 of polymerized network of suitable liquid crystalline materials C6H and C10H.

FIG. 3 shows a graph of the thermal expansion as a function of temperature of two liquid crystalline networks formed by polymerization of monomers C6H and C10H in the oriented state. Curve 20 indicates the thermal expansion for polymerized C6H in a direction perpendicular to the director and curve 22 indicates the thermal expansion for polymerized C6H in a direction parallel to the director.

Curve 24 indicates the thermal expansion for polymerized C10H in a direction perpendicular to the director and curve 26 indicates the thermal expansion for polymerized C10H in a direction parallel to the director. From FIG. 3 the differences in thermal expansion in the predetermined directions are obvious. So, when two, at room temperature straight, layers of the liquid crystalline polymerized material, but with perpendicularly oriented directors, are adhered to each other in order to form a micro-mechanical thermal structure, these layers are forced to bend at a temperature change. This is caused by the difference in thermal expansion. The thermal expansion in the layer in the direction perpendicular to the director is high and the thermal expansion in the layer parallel to director is low and may even become negative.

FIG. 4 shows a micro-mechanical thermal structure 40 made of a single layer of a liquid crystalline polymerized material with a twisted director pattern 42, wherein the mechanical coupling between the two layers is obtained intrinsically. At a higher temperature, for example, one side 44 expands along the line 46, the opposite side 48 of the layer contracts along the line 50. As a result, the layer bends in a direction along the line 52.

Alternatively, the liquid crystalline molecules are splay oriented, with the director at one side of the single layer oriented parallel to the single layer and the director at the other side of the single layer oriented perpendicular to the single layer.

FIG. 5 shows a flow chart of a manufacturing method for micro-mechanical thermal structures with a twisted molecular arrangement. In a first step 54, a mold 56 with the desired surface relief 58 depending on the outlines of a desired micro-mechanical thermal structure is provided with an orientation inducing layer 60, for example by coating the surface relief 58 with a photo-alignment layer 60. Suitable photo-alignment layers can be used to provide the mold 56 with orientation layers that locally provide a predetermined molecular orientation of the liquid crystalline monomer. These photo-alignment layers are, for example, based on cinnamic esters that can undergo an anistropic 1.2 cyclo-addition by exposure with polarized light. These photo-alignment layers are known from "Photoalignment and photo-patterning of planar and homeotropic liquid-crystal-display configuration" by H. Sieberle and M. Shadt, Journal SID, 8/1, 67-70, 2000 and "Photoinduces surface alignment for liquid crystal displays" by M. O'Neill and S. M. Kelly in Journal of Physics D: Appl. Phys., 33, R67-R84, 2000.

Alternatively, the photo-alignment layers can be based on photo-sensitized polyimides that, by photoreactions selected by a person skilled in the art, provide the anisotropy to align the liquid crystalline material that is brought into contact with the photo-alignment layer 60. Photo-alignment layers are commercially available and can be obtained from Vantico, JSR and Nissan.

In a subsequent step 62, the surface relief 58 is exposed to ultra-violet light with a first linear polarization direction. In a further subsequent step 64, the surface relief is exposed to ultra-violet light having a second linear polarization direction, different from the first polarization direction. These exposures provide a predetermined orientation-inducing structure at the mold surface relief 58. It is also possible to apply a photo-alignment layer that orients liquid crystalline molecules perpendicularly to the surface of the mold 56 without exposure and align the liquid crystalline molecules in a predetermined planar direction upon ultra-violet exposure. This type of photo-alignment has the advantage that only a single exposure is required during the mold preparation, to provide a predetermined director orientation in the reactive liquid crystal monomers.

In a further subsequent step 66, a substrate 68 is positioned opposite the mold 56 and a reactive liquid crystalline monomer 70 is pressed between the mold 56 and a substrate 68. After a waiting period, wherein the predetermined molecular orientation in the liquid crystalline monomer is obtained, the monomer is polymerized by exposure to ultra-violet radiation. Preferably, during the waiting period, a thermal annealing step can be applied to promote obtaining the predetermined molecular orientation of the liquid crystalline monomer. A suitable liquid crystalline monomer is C6H or C10H.

In a further subsequent step 72, the mold 54 is removed and the micro-mechanical thermal structure 73 is obtained. The mold 54 in FIG. 5 forms a single micro-mechanical thermal structure 73. However, it is also possible to form a mold for arrays of micro-mechanical thermal structures on a single substrate to manufacture a thermo-optical modulator.

FIG. 6 shows a thermo-optical modulator 74 comprising polymer walls 75. At a first temperature, the polymer walls 75 are perpendicular to a preferably transparent substrate 76. Preferably, the polymers walls 75 are provided with a reflective coating (not shown), for example Al, Ag or Au. It's also possible to provide the polymer walls 74 with an absorbing coating (not shown), for example CrO2.

Alternatively, the polymer walls 75 can be made self-absorbing by adding a dichroic guest-host dye such as iodine polyvinylacetate applied in polarizers conventionally used in liquid crystalline display devices. In the undeformed state, the polymer walls 75 are straight and the thermo-optical modulator 74 transmits substantially all incident light 77 via the transparent substrate 72. In a second deformed state, at a second, higher, temperature, the polymer walls 72 of the thermo-optical modulator 74 are bent and will thereby block substantially all the incident light 77. The opposite arrows indicate the reversibility of the switching process when the temperature returns to its initial value.

The transmission of this thermo-optical modulator can be calculated using formula (1)

$$Tr = \frac{p - (d_1 + d_2) - \xi}{p} \cdot 100\% \quad (1)$$

wherein

Tr represents the transmission, p represents the pitch or distance between adjacent polymer walls on the substrate, $d_1, d_2$ represent the thickness of the first and second layers respectively of each wall, and $\xi$ represents the projected deformation.

The projected deformation can be estimated from $\gamma_1$ and $\gamma_2$, the thermal expansion coefficient, perpendicular and parallel to the director, respectively, by using formula (2)

$$\xi = r\left[1 - \cos\left(\frac{h}{r}\right)\right] \quad (2)$$

Wherein h represents the height of the polymer walls and r is calculated by means of formula (3)

$$r = \frac{d_1(1 + \gamma_2 \Delta T) + d_2(1 + \gamma_1 \Delta T)}{(\gamma_1 - \gamma_2)\Delta T} \quad (3)$$

For liquid crystalline polymerized materials the thermal expansion coefficients $\gamma_1$ and $\gamma_2$ start to deviate from each other around the glass transition temperature of the composing polymers. As a result, the transmission around this glass transition temperature exhibits a sharp transition. This is modeled for a thermo-optical modulator having different wall geometries.

FIG. 7 shows a graph 81 representing the transmission of a thermo-optical modulator as a function of the temperature of the thermo-optical modulator for a device having a constant pitch p of 20 micrometers and a thickness $d_1, d_2$ of 2 micrometers for different heights. The curves 82-85 show the transmission Tr as a function of temperature T for a height h of the polymer wall of 10, 20, 30 and 40 micrometers, respectively.

Furthermore, FIG. 7 shows a graph 86 representing the transmission of a thermo-optical modulator as a function of the temperature of the thermo-optical modulator for a device having a constant height h of 30 micrometers and a thickness $d_1, d_2$ of 2 micrometers for different pitches. The curves 87-90 show the transmission Tr as a function of temperature T for a pitch p of the polymer walls of 10, 20, 30 and 40 micrometers, respectively.

It will be obvious that many variations are possible within the scope of the invention without departing from the scope of the appended claims.

The invention claimed is:

1. A micro-mechanical thermal structure, comprising:
two layers of material with different thermal expansion coefficients in a first direction and a second direction respectively, the first direction being transverse to the second direction and the two layers comprising an oriented polymer, wherein the director of the molecules of the oriented polymer of the first layer is transverse to the director of the molecules of the oriented polymer of the second layer.

2. A micro-mechanical thermal structure as claimed in claim 1 wherein the oriented polymer comprises a liquid crystalline polymeric material.

3. A micro-mechanical thermal structure as claimed in claim 1 wherein the two layers constitute a single layer wherein the director of the liquid crystalline molecules on one side of the single layer is rotated with respect to the director of the liquid crystalline molecules on the opposite side of the single layer.

4. A micro-mechanical thermal structure as claimed in claim 3, wherein the liquid crystalline molecules are splay oriented with the director at one side of the single layer being oriented parallel to the single layer and the director at the other side of the single layer being oriented perpendicular to the single layer.

5. A micro-mechanical thermal structure as claimed in claim 1 wherein the director of the liquid crystalline molecules is parallel to the layers.

6. A thermo-optical modulator comprising a plurality of micro-mechanical thermal structures ordered on a substrate, each micro-mechanical thermal structure comprising two layers of material with different thermal expansion coefficients in a first direction and a second direction respectively, the first direction being transverse to the second direction and the two layers comprising an oriented polymer, wherein the director of the molecules of the oriented polymer of the first layer is transverse to the director of the molecules of the oriented polymer of the second layer.

7. The thermo-optical modulator of claim 6 wherein the micro-mechanical thermal structures are each provided with a reflective coating on exterior surfaces thereof.

8. Thermo-optical modulator as claimed in claim 6 wherein the oriented polymer layers comprise a dichroic guest-host dye for absorbing light.

9. The micro-mechanical thermal structure of claim 1, wherein the two layers are made of a same liquid crystalline polymerized material as each other.

10. The micro-mechanical thermal structure of claim 1, wherein at least one of the two layers comprising at least one of C6H and C10H.

11. The micro-mechanical thermal structure of claim 1, wherein each of the two layers comprises one of C6H and C10H.

12. The micro-mechanical thermal structure of claim 1, further comprising a reflective material coated on an exterior surface thereof.

13. The micro-mechanical thermal structure of claim 1, further comprising an absorbing material coated on an exterior surface thereof.

14. The micro-mechanical thermal structure of claim 13, wherein the absorbing material is CrO2.

15. The thermo-optical modulator of claim 6, wherein the micro-mechanical thermal structures are each provided with an absorbing coating on exterior surfaces thereof.

16. The thermo-optical modulator of claim 6, wherein each of the structures has a first proximal end the substrate and a second distal end, wherein each of the structures extends perpendicularly to the substrate from the proximal end to the distal end when the structure is at a first, lower temperature, and such that each structure is deformed to bend from the proximal end to the distal end when the structure is at a second temperature greater than the first temperature.

17. The thermo-optical modulator of claim 16, wherein the first and second layers comprise a polymer having a glass transition temperature, and wherein the first temperature is below the glass transition temperature, and the second temperature is above the glass transition temperature.

18. The thermo-optical modulator of claim 6, wherein the each of the structures has a thickness in a direction parallel to the substrate, and wherein the height of each structure is at least 5 times the thickness.

\* \* \* \* \*